(12) United States Patent
Zhang et al.

(10) Patent No.: US 6,445,623 B1
(45) Date of Patent: Sep. 3, 2002

(54) CHARGE PUMPS WITH CURRENT SOURCES FOR REGULATION

(75) Inventors: Haoran Zhang; Gregory S. Waterfall, both of Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/934,931

(22) Filed: Aug. 22, 2001

(51) Int. Cl.$^7$ ................................................. G11C 7/00
(52) U.S. Cl. ................................................. 365/189.11
(58) Field of Search ....................... 365/189.09, 189.11; 323/282

(56) References Cited

U.S. PATENT DOCUMENTS

| | | | |
|---|---|---|---|
| 5,359,552 A | * 10/1994 | Dhong et al. | 365/189.09 |
| 5,675,241 A | * 10/1997 | Teggatz et al. | 323/282 |
| 5,717,581 A | 2/1998 | Canclini | 363/40 |
| 5,973,944 A | 10/1999 | Nork | 363/60 |

OTHER PUBLICATIONS

Linear Technology Corporation, LTC1515 Series, "Step–Up/Step–Down Switched Capacitor DC/DC Converters with Reset," *Technical Data Sheet*, pp 1–8.
Maxim Integrated Products, MAX679, "Regulated 3.3V Charge Pump ," Apr. 1997, *Technical Data Sheet*, pp 1–6.
Erich Bayer and Hans Schmeller, "Tomorrows Charge Pumps—Today," Apr.–Jun. 2000, European Technology, *TI Technical Journal*, Technical Paper, pp 1–8.
Robert St. Pierre, Gain Technology Corporation, "Low–Power BiCMOS Op Amp with Integrated Current Mode Charge Pump," *Technical Paper*.
Maxim Integrated Products, MAX1747, "Triple Charge–Pump TFT LCD DC–DC Converter,"Oct. 2000, *Technical Data Sheet*, pp 1–13.

\* cited by examiner

*Primary Examiner*—Vu A. Le
(74) *Attorney, Agent, or Firm*—W. Daniel Swayze, Jr.; W. James Brady; Frederick J. Telecky, Jr.

(57) ABSTRACT

A charge pump circuit is provided for reducing the voltage ripple and EMI associated with prior art circuits. The charge pump circuit is configured with at least one current source for suitably controlling the charging and/or discharging current in the charge pump capacitors the currents of the current sources are determined by the load current requirements, rather than the on-resistance of any switches or the ESR of any capacitors, thus allowing a significant reduction of the peak current drawn from the power supply as well as the peak current injected into the output reservoir capacitor. The charge pump circuit can be configured with a current source in series with the input supply voltage to control the total current in the charge pump. In addition, the charge pump circuit can be configured with current limited switches for controlling the total current. For example, current sources can be suitably configured to replace one or more switches in the charge pump circuit to effectively control the total current in the charge pump circuit. By feeding the charge pump capacitors with switched current sources, the voltage across the current sources can be suitably limited to the supply voltage or the output voltage. In addition, the current sources can operate as resistor devices with adjustable impedances, and be configured to suitably reduce or eliminate the excessive supply voltage across the current sources. Further, the switched current sources can comprise various current mirror configurations. As a result, the requirement for the breakdown voltage can be significantly reduced. In addition, through use of a low voltage process, the cost and packaging size can be suitably reduced.

22 Claims, 3 Drawing Sheets

CHARGE PUMPS WITH CURRENT SOURCES FOR REGULATION

FIELD OF INVENTION

The present invention relates to charge pumps for use in integrated circuits. More particularly, the present invention relates to a charge pump circuit having current sources configured for supplying current to the charge pump capacitors to regulate the charging and discharging current of the charge pump.

BACKGROUND OF THE INVENTION

The demand for less expensive, and yet more reliable integrated circuit components for use in communication, imaging and high-quality video applications continues to increase rapidly. As a result, integrated circuit manufacturers are requiring improved performance in the voltage supplies and references for such components and devices to meet the design requirements of such emerging applications.

One device utilized for providing a regulated voltage supply is a charge pump circuit. Charge pumps are DC/DC converters that utilize a capacitor instead of an inductor or transformer for energy storage, and are configured for generating positive or negative voltages from the input voltage. One more common type of charge pump utilized in circuits comprises one configured for doubling the input voltage, i.e., a charge pump voltage doubler, while other frequently utilized charge pumps comprises tripler and inverter configurations. These charge pumps can operate to multiply the input voltage by some factor, such as by one-half, two, or three times or any other suitable factor of the input voltage, to generate the desired output voltage.

Charge pumps typically utilize transistors and/or diodes as ideal switching devices to provide current paths for charge transfer. On occasions when the sum of any residual voltages of the charging capacitors in a charging/discharging circuit loop is smaller than the voltage of the power supply, a significantly large amount of transient current tends to flow within the loop. Further, an uncontrolled peak current occurring during charging or discharging of the capacitors is only limited by the "on-resistance" of the switching devices and the equivalent series resistance (ESR) of the capacitors. Moreover, the uncontrolled alternating peak current generally flows out of the positive power supply and into the negative power supply, e.g., into ground, thus causing significantly large electromagnetic interference (EMI) to associated electronic circuits. Still further, the large uncontrolled current also tends to charge the output reservoir capacitor which results in large voltage ripples at the output of the charge pump.

To limit the voltage ripple to a tolerable level, the reservoir capacitor can be configured with a larger capacitance value. However, such an arrangement is not desirable in that such a larger value capacitor results in a larger total printed circuit board area and higher manufacturing costs.

Another problem related to charge pump voltage doublers, triplers and inverters is the requirement for higher voltage processes than the nominal supply voltage. Since the output voltage, or the voltage at the internal nodes compared to the lowest potential in the charge pump circuit, can reach a level twice or more of the supply voltage, the breakdown voltage requirement for the processes used to manufacture these charge pumps is not limited by the supply voltage or the output voltage. Moreover, the voltage across some of the switching devices within the charge pumps may exceed the maximum allowable voltage for a given process. Accordingly, processes with higher breakdown voltages are essential requirements for charge pump regulators implemented within integrated circuit applications, thus resulting in increased costs and circuit size compared to circuits implemented in low voltage processes.

Figure 1:
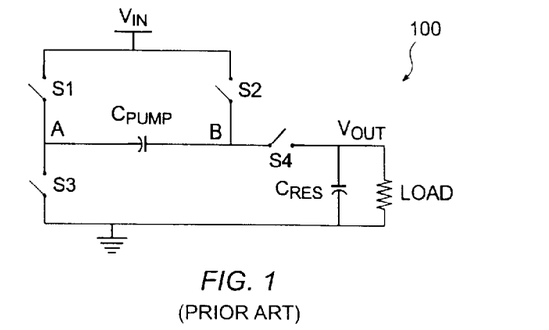
FIG. 1 illustrates a schematic diagram of a prior art charge pump doubler circuit.

With reference to FIG. 1, a conventional charge pump 100 configured as a voltage doubler is illustrated. Charge pump doubler 100 comprises four switches S1, S2, S3 and S4, a pump capacitor $C_{PUMP}$, and a reservoir capacitor $C_{RES}$. The charging and discharging current of capacitor $C_{PUMP}$ is determined by the difference between an supply voltage $V_{IN}$ and an output voltage $V_{OUT}$, the on-resistance for the switches S1, S2, S3 and S4, and the ESR of capacitors $C_{PUMP}$ and $C_{RES}$.

Charge pump doubler 100 is typically controlled by a clock having a 50% duty cycle, i.e., a clock having a clock phase-one and phase-two. During clock phase-one, switches S2 and S3 are turned "on" to charge capacitor $C_{PUMP}$ to approximately the supply voltage $V_{IN}$, while switches S1 and S4 remain in an "off" condition. During clock phase-two, switches S1 and S4 are turned "on", while switches S2 and S3 are turned "off", to charge capacitor $C_{RES}$ to a higher voltage potential. If the output voltage $V_{OUT}$ is not otherwise regulated, output voltage $V_{OUT}$ will reach a value of approximately twice the supply voltage $V_{IN}$.

The selection of the on-resistance for switches S1, S2, S3 and S4 is difficult, in that while switches S1, S2, S3 and S4 generally need to be configured to provide a high enough on-resistance to limit any inrush current, switches S1, S2, S3 and S4 must also be configured to provide a low enough on-resistance to output sufficient current at a low level of supply voltage $V_{IN}$. Due to the concurrent need to provide such a low enough on-resistance, a large inrush of current can occur during the closing of switches S2 and S3, or S1 and S4, thus resulting in conductive noise within the charge pump doubler 100. In addition, the on-resistances of switches S1, S2, S3 and S4 are generally configured on the same order of magnitude in an attempt to optimize performance and minimize the die size, and thus the voltage drops on all switches S1, S2, S3 and S4 are also on the same order of magnitude, regardless of the location and purpose of switches S1, S2, S3 and S4, e.g., whether for charging or discharging functions.

As discussed, higher voltage processes are generally required for prior art charge pumps. For example, with reference to FIG. 1, let's assess a case where $V_{IN}$ and $V_{OUT}$ have the same voltage level and S1 and S4 have the same on-resistance, RON, i.e., the sizes of S1 and S4 are similar. In steady state, pump capacitor $C_{PUMP}$ may be charged to a voltage close to $V_{IN}$ in the charging phase, and S2 and S3 are "closed," and S1 and S4 are "open." At the moment S2 and S3 are opened and S1 and S4 are closed, due to the fact that S1 and S4 have the same on-resistance $R_{ON}$ and the voltage across $C_{PUMP}$, i.e., $V_{PUMP}$ equals $V_{IN}$ and $V_{OUT}$, the inrush current, $I_{INRUSH}$ becomes:

$$(V_{IN}+V_{PUMP}-V_{OUT})/(2*R_{ON}) \text{ or } V_{OUT}/(2*R_{ON}).$$

Therefore, the voltage at node B, $V_B$, becomes much higher than $V_{IN}$ or $V_{OUT}$:

$$V_B=V_{OUT}+I_{INRUSH}*R_{ON}, \text{ or } V_B=1.5*V_{OUT}.$$

This result means that the breakdown voltage of the process needs to be at least 1.5 times the rated input or output voltage of the regulator.

Accordingly, this scenario prevents processes with voltage ratings as low as the supply voltage $V_{IN}$ and the output voltage $V_{OUT}$ from being utilized for charge pump doublers. Moreover, as the supply voltage $V_{IN}$ increases from a low level to a high level, the on-resistance of switches S1, S2, S3 and S4 tends to decrease exponentially to a very low level due to a higher gate driving voltage. Accordingly, the current flowing through, i.e., the current flowing to ground and to capacitor $C_{RES}$, becomes excessively large, thus resulting in uncontrolled output voltage ripple and conducted EMI.

A large number of currently available charge pumps, including charge pump regulators known as switched-capacitor regulators, utilize low on-resistance switches in order to boost current output capability at low supply voltages. The use of low on-resistance switches causes the injection of large uncontrolled pulsed current into the output or reservoir capacitor and to ground, thus generating larger EMI and output voltage ripple.

Figure 2:
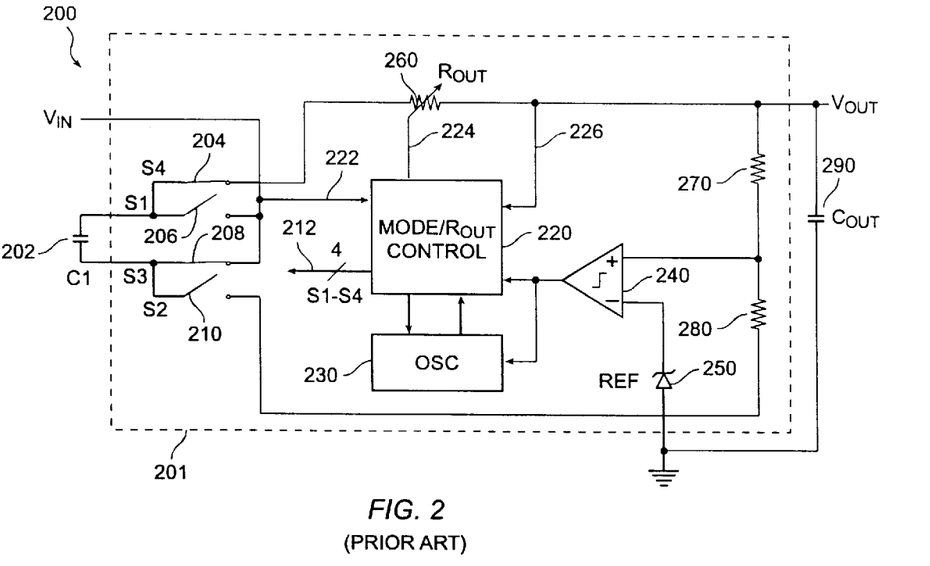
FIG. 2 illustrates a schematic diagram of a prior art switched regulator circuit.

One approach for resolving the problems discussed above is disclosed in U.S. Pat. No. 5,973,944, issued on Oct. 26, 1999 to Nork and assigned to Linear Technology Corporation ("Nork"), discloses a switching regulator circuit using a common switch network. With reference to FIG. 2, a switched capacitor step-up and step-down DC-DC converter circuit 200 is illustrated. Nork discloses that a converter 200 includes control circuitry 201 for sensing the voltage differential between the input and output voltages, and which enables the minimum number of switch sections needed to fully regulate the output, while using the highest on-resistance possible to minimize the inrush current.

Despite the use of multiple switches for monitoring the output of the circuit, this converter has its drawbacks, such as high output voltage ripple. For example, one related approach includes the use of multiple transistors in a parallel configuration to provide the switches for the charge pump circuit. In this example, a switched capacitor DC/DC converter available from Linear Technology Corporation, known as the model LTC1515 converter, utilizes three binary-weighted transistors having a different on-resistance for one or more of the switches in a charge pump doubler circuit. During operation, when the input supply voltage is low, all of the paralleled transistors are turned "on" resulting in a low on-resistance that allows sufficient current to flow. On the other hand, when the input supply voltage is high, smaller transistors are turned "on" to provide higher on-resistance which can limit the peak charging/discharging current.

However, due to the small number of paralleled transistors, the peak current and output voltage ripple realize significant step increases as the supply voltage is varied. In other words, while using split switches comprising paralleled transistors can facilitate better control over the charging and discharging currents than single transistor switches, such control methods result in steps in the magnitude of the charging and discharging currents, due to the discrete step changes in the magnitude of the on-resistance of the switches. In addition, within each step, the peak current is still dependent upon the level of the supply voltage. Although increasing the number and frequency of the discrete steps, i.e., the different levels of on-resistance of the paralleled transistors, can increase the resolution of the current control, such a solution also requires the implementation of an analog-to-digital converter, and thus more area on the integrated circuit. Moreover, such a control scheme may provide a slow response characteristic to any rapid supply voltage and load variations. Further, such a control scheme does not enable the utilization of a low voltage process for the charge pump regulators with the input voltage as it increases to the breakdown voltage level.

Another approach to the above problems with charge pumps includes the use of a small transistor in parallel with a large transistor, for example a transistor ten times the size of the small transistor, to provide one of the switches in the charge pump circuit. The large transistor is utilized to switch "on" and "off" the current in normal operations regardless of the supply voltage, while the small switch is utilized only during the startup condition to limit the startup in-rush current. However, this approach limits the current only during the startup condition, which results in a prolonged startup process due to the small startup current. Moreover, this approach does not limit the current or reduce the output voltage ripple after the charge pump circuit initiates operation. Still further, like the paralleled transistor approach above, this approach does not enable the utilization of a low voltage process for the charge pump regulators with the input voltage as it increases to the breakdown voltage level.

More recent approaches have attempted to include a switch circuit configured for regulating the charge pump by varying the impedance of the switch circuit at a fixed frequency. While such an approach may be able to regulate the output voltage, the approach does not sufficiently address output ripple or inrush current.

Still further, other approaches have included attempts to introduce a single-current source in series with switch $S_1$, and then regulate the charge pump at a fixed frequency, i.e., linearly regulate the amount of charge on the output per cycle. However, such approaches are generally more difficult and less efficient, and only address output voltage ripple.

Accordingly, a need exists for an improved charge pump regulator that can provide reduced output voltage ripple, a lower inrush of current, and reduced EMI emissions. In addition, a need exists for an charge pump regulator to operate with a low voltage process with the input voltage up to the breakdown voltage level, without significantly increasing the costs and size of the circuit.

SUMMARY OF THE INVENTION

The charge pump circuit according to the present invention addresses many of the shortcomings of the prior art. In accordance with various aspects of the present invention, a charge pump circuit is configured with one or more current sources for suitably controlling the charging and/or discharging current in the charge pump capacitors. In accordance with one aspect of the present invention, the currents of the current sources can be determined by the load current requirements, rather than the on-resistance of any switches or the ESR of any capacitors, thus allowing a significant reduction of the peak current drawn from the power supply as well as the peak current injected into the output reservoir capacitor. In accordance with an exemplary embodiment, the charge pump circuit is suitably configured with a current source in series with the input supply voltage to control the total current in the charge pump. The current sources can comprise various types of current source configurations in accordance with various exemplary embodiments of the present invention. As a result, the output voltage ripple can be minimized with significantly reduced capacitance requirements for the output reservoir capacitor, in addition to significantly reducing the conducted EMI.

In accordance with another aspect of the present invention, the charge pump circuit can be configured with current limited switches for controlling the total current. For example, current sources can be suitably configured to replace one or more switches in the charge pump circuit to effectively control the total current in the charge pump circuit. By feeding the charge pump capacitors with switched current sources, the voltage across the current sources can be suitably limited to the supply voltage or the output voltage. In addition, the current sources can operate as resistor devices with adjustable impedances, and be configured to suitably reduce or eliminate the excessive supply voltage across the current sources. In accordance with various exemplary embodiments, the switched current sources can comprise various current mirror configurations. As a result, the requirement for the breakdown voltage can be significantly reduced. In addition, through use of a low voltage process, the cost and packaging size can be suitably reduced.

In accordance with another aspect of the present invention, it may be desirable for an exemplary charge pump circuit to be configured to utilize a large charging/discharging current to suitably maximize the power available at the output load. In accordance with this aspect of the present invention, any current limited switches can be suitably disabled or otherwise configured to provide a lower on-resistance to enable a larger charging/discharging current into the charge pump circuit, such as when the input supply voltage is low.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION

The present invention may be described herein in terms of various functional components and various processing steps. It should be appreciated that such functional components may be realized by any number of hardware or structural components configured to perform the specified functions. For example, the present invention may employ various integrated components, e.g., buffers, supply rail references, current mirrors, logic devices and the like, which are comprised of various electrical devices, e.g., resistors, transistors, capacitors, diodes and the like whose values may be suitably configured for various intended purposes. In addition, the present invention may be practiced in any integrated circuit application where regulated voltage supplies are desired. Such general applications that may be appreciated by those skilled in the art in light of the present disclosure are not described in detail herein. However for purposes of illustration only, exemplary embodiments of the present invention will be described herein in connection with a charge pump doubler and/or tripler. Further, it should be noted that while various components may be suitably coupled or connected to other components within exemplary circuits, such connections and couplings can be realized either by direct connection between components, or by connection through other components and devices located therebetween.

As discussed above, previous approaches for solving the problems of pump charge circuits have difficulty in limiting the voltage ripple and inrush current, as well as being incapable of using low voltage processes for the charge pump regulators with the input voltage up to the breakdown voltage. However, in accordance with various aspects of the present invention, a charge pump circuit is suitably configured with one or more current sources for suitably controlling the charging and/or discharging current in the pump capacitors to a desired value. Such a configuration can be effective since the output ripple of a charge pump regulator is proportional to the current into an output reservoir capacitor and the duration of the charging period. Thus, the peak charging/discharging current can be well controlled and limited to a desired value.

In accordance with one aspect of the present invention, the currents of the current sources are determined by the load current requirements, rather than the on-resistance of any switches or the ESR of any capacitors. In addition, the current is independent of the input and output voltages, i.e., the current can be automatically adjusted and controlled without steps at different input and output voltages, thus allowing a significant reduction of the peak current drawn from the power supply as well as the peak current injected into the output reservoir capacitor.

In accordance with an exemplary embodiment, the charge pump circuit is suitably configured with a current source in series with the input supply voltage to control the total current in the charge pump, e.g., the current flowing into the charge pump capacitor can be suitably limited and/or otherwise controlled during the charging and discharging phases. As a result, the output voltage ripple can be minimized along with significantly reduced capacitance requirements for the output reservoir capacitor, in addition to significantly reducing the conducted EMI.

Figure 3:
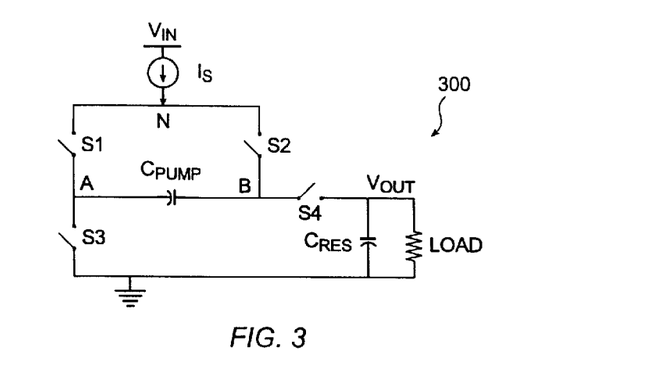
FIG. 3 illustrates a schematic diagram of an exemplary charge pump circuit in accordance with an exemplary embodiment of the present invention.

For example, with reference to FIG. 3, a charge pump circuit 300 is illustrated which comprises a charge pump voltage doubler including a current source $I_S$ configured in series with a supply voltage $V_{IN}$, i.e., connected between supply voltage $V_{IN}$ and a node N, and coupled to switches S1 and S2. In accordance with this embodiment, current source is configured to suitably control the total current flowing into charge pump circuit 300 based on the load current requirements. In other words, current source $I_S$ is configured such that the current flowing through capacitor $C_{PUMP}$ is independent of supply voltage $V_{IN}$ and output voltage $V_{OUT}$.

Operation of circuit 300 through switches S1 through S4 is similar to that described above. For example, during a clock phase-one, switches S2 and S3 can be turned "on" to charge capacitor $C_{PUMP}$ to approximately the supply voltage $V_{IN}$, while switches S1 and S4 can remain "off", while during a clock phase-two, switches S1 and S4 can be turned "on", switches S2 and S3 can be turned "off", and capacitor $C_{RES}$ can be charged to a higher voltage potential, approximately twice the supply voltage $V_{IN}$. However, unlike the circuits described above, since the current through capacitor $C_{PUMP}$ and switches S1, S2, S3 and S4 is equal to the total supply current of current source $I_S$, there is no excessive current flowing into ground to output capacitor $C_{RES}$. Moreover, the output voltage ripple and EMI can be significantly reduced.

In addition, since the on-resistances of switches S1, S2, S3 and S4 are very small compared to the equivalent resistance of current source $I_S$, all of the internal nodal voltages are essentially less than both supply voltage $V_{IN}$ and output voltage $V_{OUT}$, with only the voltage at node B being slightly higher than output voltage $V_{OUT}$ by a small amount due to the small voltage drop across switch S4. Accordingly, low voltage processes with a breakdown voltage at the level of the supply voltage $V_{IN}$ and output voltage $V_{OUT}$ can be suitably utilized.

Current source $I_S$ can comprise various types of current source configurations in accordance with various exemplary embodiments of the present invention. For example, current source $I_S$ can comprise any conventional circuit configured for providing a current into a load. In accordance with various exemplary embodiments, current source $I_S$ can comprise one of various current mirror configurations. In addition, current source $I_S$ is configured such that the current supplied from the input power supply is at a minimum, yet sufficient enough for any necessary load requirements. Accordingly, the conducted EMI, which is dependent on the magnitude of the supply current or ground current, and the output voltage ripple can be suitably minimized or reduced.

Figure 5:
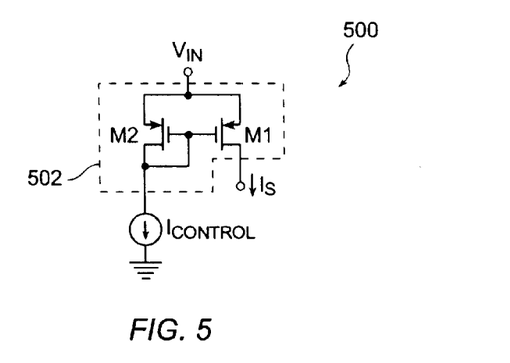
FIG. 5 illustrates a schematic diagram of an exemplary current source as may be implemented within a charge pump circuit in accordance with the present invention.

For example, in accordance with an exemplary embodiment for current source $I_S$, with reference to FIG. 5, an exemplary current source circuit 500 comprising a single current mirror configuration is illustrated. In accordance with this embodiment, current source circuit 500 comprises a current mirror configuration 502 comprising a transistor M1 and a diode-connected transistor M2, with the sources of transistors M1 and M2 suitably connected to a supply voltage VIN. In addition, the drain of transistor M2 is suitably connected to a current source $I_{CONTROL}$, while the drain of transistor M1 is configured to provide the output current $I_S$. Current source $I_{CONTROL}$ can be derived from any current reference or from various control signals. As a result of current mirror configuration 502, the current from current source $I_{CONTROL}$ is suitably mirrored to the output current $I_S$ at a ratio m determined by the ratio of sizes for transistors M1 and M2, i.e., the output current $I_S=m \times I_{CONTROL}$. Further, the output current $I_S$ is configured to be relatively independent of the supply voltage VIN.

While transistors M1 and M2 are illustrated as PMOS transistors, it should be noted that transistors M1 and M2 can also suitably comprise NMOS transistor devices. Moreover, other types of semiconductor devices, such as bipolar transistors, i.e., PNP and NPN transistors, could be implemented in accordance with various other embodiments of the present invention.

While a charge pump doubler circuit 300 is disclosed above in accordance with one exemplary embodiment, it should be noted that such an exemplary embodiment is merely for illustration purposes, and that the charge pump circuits of the present invention are not so limited. Instead, the charge pump circuits can comprise any configuration of charge pumps having current sources for supplying and controlling the total current in the charge pumps to suitably reduce the output voltage ripple and the EMI. Thus, in accordance with various other exemplary embodiments, charge pump circuit can comprise charge pump voltage triplers and inverters.

Figure 7:
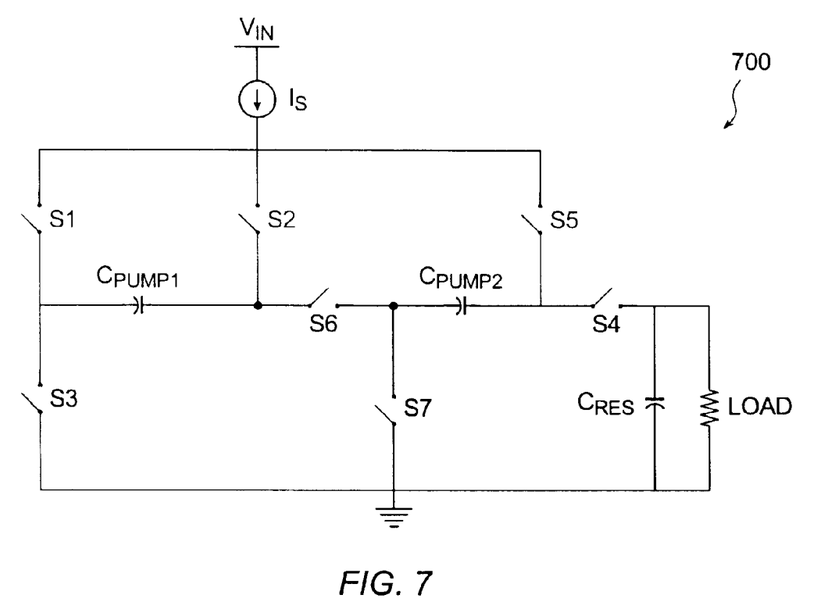
FIG. 7 illustrates a schematic diagram of an exemplary charge pump circuit in accordance with another exemplary embodiment of the present invention.

For example, with reference to FIG. 7, an exemplary charge pump tripler circuit 700 is illustrated in accordance with another exemplary embodiment of the present invention. In accordance with this embodiment, charge pump tripler circuit 700 suitably comprises a pair of pump capacitors $C_{PUMP1}$ and $C_{PUMP2}$ configured with switches S1 through S7 and a supply voltage $V_{IN}$. In operation, during a clock phase-one, switches S2 and S3 and switches S5 and S7 are suitably turned "on" to charge each of capacitors $C_{PUMP1}$, and $C_{PUMP2}$ in parallel to approximately the supply voltage $V_{IN}$, and switches S1, S4 and S6 are suitably turned "off." During a clock phase-two, switches S1, S6 and S4 are turned "on", switches S2 and S3 and switches S5 and S7 are turned "off", and capacitor $C_{RES}$ is charged to a higher voltage potential, approximately up to three times the supply voltage $V_{IN}$. Accordingly, like the results of charge pump circuit 300, charge pump tripler circuit 700 is suitably configured to control or otherwise limit the total currents within capacitors $C_{PUMP1}$ and $C_{PUMP2}$ and yet meet the load requirements, thus minimizing the voltage ripple and EMI.

In accordance with another aspect of the present invention, the charge pump circuit can be configured with current limited switches for controlling the total current. In accordance with this aspect of the present invention, current sources can be suitably configured to replace one or more switches in the charge pump circuit to effectively control the total current in the charge pump circuit, i.e., the functions of the switches in the charge pump circuit can be suitably replaced by switched current sources or current limited switches.

In accordance with this aspect of the present invention, the current sources can be configured as resistive devices with adjustable impedances which can be configured to regulate the output voltage by changing the switching frequency. Through this configuration, the current sources can suitably reduce the excessive voltage that may be developed across all the devices. In other words, the adjustable impedance and frequency switching configuration of the current sources facilitates the handling of a voltage drop across the current sources as needed by the charge pump circuit, thus permitting low voltage processes to be effectively utilized.

In addition, the current provided by the current sources is independent of the supply voltage and the output voltage, and can be suitably adjusted and controlled without discrete steps at different supply and output voltages. As a result, the internal voltages and the voltage across every device can be limited to the same level as the supply voltage or the output voltage, which ever is higher. In addition, like the current sources above, the switched current sources can be configured such that the current supplied from the input power supply is at a minimum, yet sufficient enough to the any necessary load requirements. Accordingly, the conducted EMI, which is dependent on the magnitude of the supply current or ground current, and the output voltage ripple can be suitably minimized or reduced.

Figure 4:
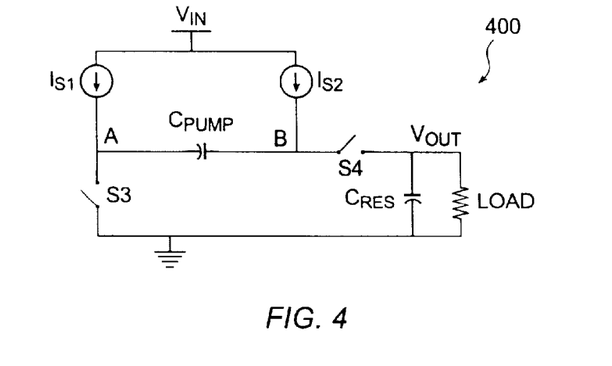
FIG. 4 illustrates a schematic diagram of an exemplary charge pump circuit in accordance with another exemplary embodiment of the present invention.

For example, with reference to FIG. 4, a charge pump circuit 400 is illustrated and which comprises a pair of switch current sources $I_{S1}$, and $I_{S2}$ configured in replace of two switches S1 and S2. In accordance with this exemplary embodiment, switch current sources $I_{S1}$, and $I_{S2}$ are suitably configured to operate in a manner similar to the operation of switches S1 and S2 of circuit 300 to suitably allow for the charging and discharging of capacitor $C_{PUMP}$ with controlled currents.

In addition, in that suitably current source $I_{S1}$, includes a high equivalent resistance and thus has an adequate voltage drop, and due to the limited current in current source $I_{S1}$, and the low on-resistance of switch S4, the voltage drop across switch S4 is minimal. Accordingly, in that the voltage at node B is only slightly higher than the output voltage $V_{OUT}$ by the small voltage drop across switch S4, charge pump circuit 400 is configured such that switch S4 can suitably operate under the breakdown voltage.

While the above exemplary embodiment of a charge pump circuit 400 illustrates two switch current sources $I_{S1}$, and $I_{S2}$, it should be noted that other configurations of switched current sources can also be configured in accordance with various other exemplary embodiments. For example, instead of replacing switches S1 and S2, switch current sources $I_{S1}$ and $I_{S2}$ can also be configured to replace switches S3 and S4. In addition, in accordance with another exemplary embodiment, all four switches S1, S2, S3 and S4 can be suitably replaced by switch current sources $I_{S1}$, $I_{S2}$, $I_{S3}$ and $I_{S4}$. Further, instead of replacing both switches S1 and S2, charge pump circuit 400 could be configured with only one of switches S1, S2, S3 and S4 being replaced by one of switched current sources $I_{S1}$, $I_{S2}$, $I_{S3}$ and $I_{S4}$. Accordingly, any configuration of current sources configured for controlling the total current in the charge pump circuit can be suitably implemented in accordance with various exemplary embodiments of the present invention.

Figure 8:
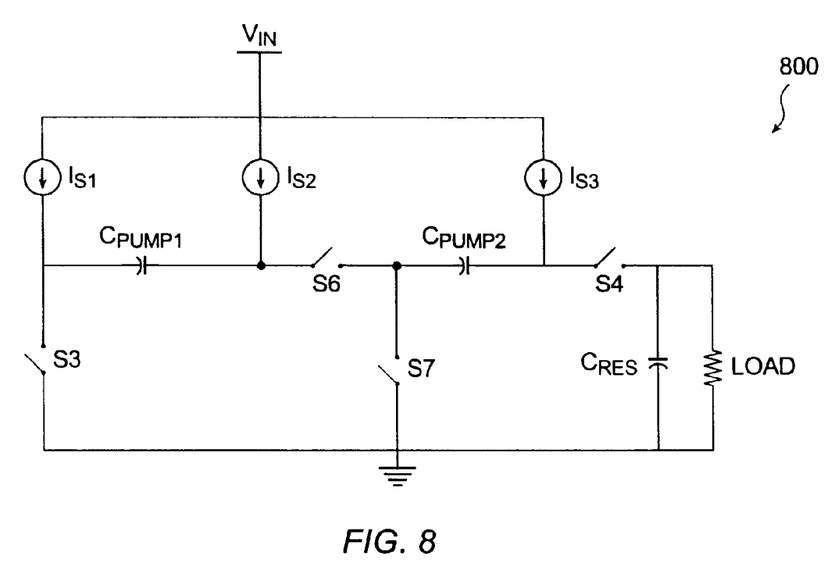
FIG. 8 illustrates a schematic diagram of an exemplary charge pump circuit in accordance with yet another exemplary embodiment of the present invention.

In addition, although a charge pump circuit 400 is illustrated in a doubler configuration, it should be noted that the switch current sources can also be configured to replace various switches in other charge pump configurations, such as charge pump triplers and inverters and the like. For example, with reference to FIG. 8, a charge pump tripler circuit 800 can be suitably configured with switched current sources $I_{S1}$, $I_{S2}$ and $I_{S3}$ configured to replace switches S1, S2 and S5 of charge pump circuit 700. Moreover, other switches of circuit 800, such as switches S3, S4 and S7 can also be suitably replaced with switch current sources.

In accordance with another aspect of the present invention, it may be desirable for charge pump circuit 400 to be configured to utilize a large charging/discharging current to suitably maximize the power available at the output load. In accordance with this aspect, any current limited switches, such as switch current sources $I_{S1}$ and $I_{S2}$, can be suitably disabled or otherwise configured to provide a lower on-resistance to enable a larger charging/discharging current into circuit 400. In accordance with an exemplary embodiment, switch current sources $I_{S1}$ and $I_{S2}$ can be suitably disabled or otherwise configured to provide a lower resistance when the input supply voltage is low to facilitate a higher charging/discharging current, thus permitting the output voltage $V_{OUT}$ at the load to become sufficiently high. Once the output voltage $V_{OUT}$ becomes sufficiently high, switched current sources $I_{S1}$, and $I_{S2}$ can again be enabled or otherwise configured to increase their resistance, thus again limiting the peak charging/discharging currents.

Current sources $I_{S1}$ and $I_{S2}$ can comprise various types of current source configurations in accordance with various exemplary embodiments of the present invention. For example, current sources $I_{S1}$ and $I_{S2}$ can comprise any conventional circuit configured for providing a current into a load. In accordance with various exemplary embodiments, current sources $I_{S1}$ and $I_{S2}$ can comprise various current mirror configurations.

Figure 6:
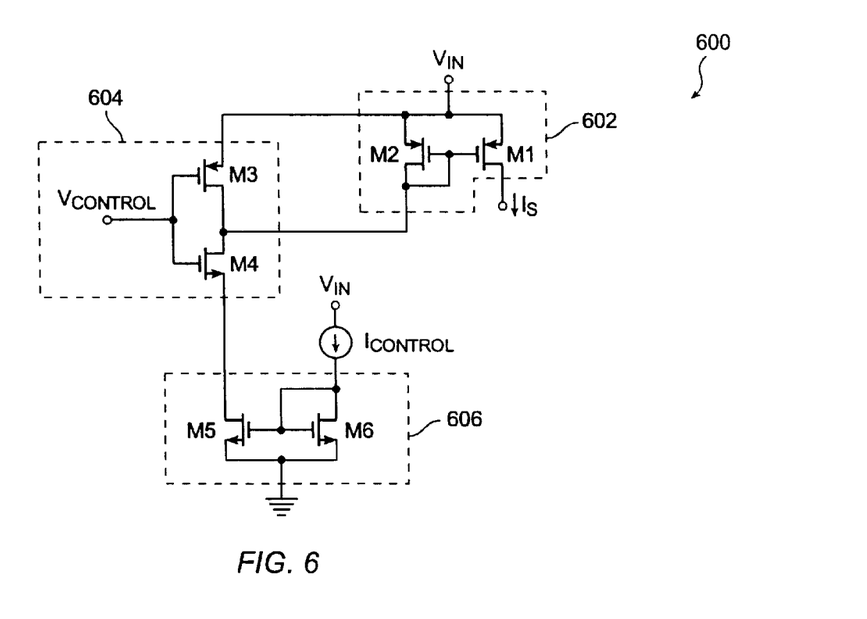
FIG. 6 illustrates a schematic diagram of another exemplary current source as may be implemented within a charge pump circuit in accordance with another exemplary embodiment of the present invention.

With reference to FIG. 6, an exemplary current source circuit 600 comprising another current mirror configuration is illustrated. In accordance with this exemplary embodiment, current source circuit 600 comprises a first current mirror 602 comprising transistor M1 coupled to an output current $I_S$ and a diode-connected transistor M2, a control circuit 604 comprising a control signal $V_{CONTROL}$ and a pair of complementary transistors M3 and M4, a second current mirror 606 comprising transistor M5 and a diode-connected transistor M6, and a current source $I_{CONTROL}$. First current mirror 602 is suitably configured with transistor M1 having a drain coupled to the output current $I_S$, with the sources of transistors M1 and M2 suitably connected to a supply voltage VIN, and with transistor M2 coupled to control circuitry 604. In addition, the current through transistor M2 is suitably mirrored to the output current $I_S$ at a ratio m determined by the ratio of sizes for transistors MI and M2.

Control circuitry 604 is configured to suitably turn current source circuit 600 "on" and "off" as desired. For coupling to first current mirror 602, control circuitry 604 comprises the connection of the source of transistor M3 to the source of transistor M2, and the connection of the drain of transistor M3 to the drain of transistor M2 Second current mirror 606 is suitably configured with transistor M5 coupled to control circuitry 604, with a drain of transistor M5 connected to a source of transistor M4, and with transistor M6 coupled to current source $I_{CONTROL}$, with current source $I_{CONTROL}$ being suitably connected to a drain of transistor M6. In addition, due to the ratio n of the sizes of transistors M5 and M6, the current in M6 can be suitably mirrored to transistor M5 as $n \times I_{CONTROL}$.

During operation, when control signal $V_{CONTROL}$ is high, transistor M4 is suitably turned "on" and transistor M3 is suitably turned "off", thus allowing current to flow from transistor M2 to transistor MS. Due to the configuration of current mirror 602, and the size ratio m of transistors M1 and M2, the output current $I_S$ equals $n \times m \times I_{CONTROL}$. When control signal $V_{CONTROL}$ is low, transistor M4 is suitably turned "off" and transistor M3 is suitably turned "on", thus turning "off" both transistors M1 and M2, and thus the output current $I_S$ is also shut "off."

While transistors M1 through M6 are illustrated as PMOS transistors, it should again be noted that transistors M1 through M6 can also suitably comprise NMOS transistor devices. Moreover, other types of semiconductor devices, such as bipolar transistors, i.e., PNP and NPN transistors, could be implemented in accordance with various other embodiments of the present invention. Further, it should be noted that although the above embodiment discloses that control circuitry 604 turns on current source circuit 600 when control signal $V_{CONTROL}$ is in a "high" condition, the exemplary embodiment could also be configured to turn on current source circuit 600 when control signal $V_{CONTROL}$ is in a "low" condition, i.e., any predefined condition may be utilized.

In addition, the above exemplary current source circuits 500 and 600 can be implemented in various manners within a charge pump configuration of the present invention. For example, with momentary reference again to FIG. 4, an exemplary charge pump circuit 400 can be configured with current source $I_{S1}$, comprising a current source circuit 500 in series with a switch S1, and current source $I_{S2}$ comprising a current source circuit 600 replacing switch S2. Alternatively, in accordance with another embodiment, exemplary charge pump circuit 400 can be configured with current source $I_{S1}$ comprising current source circuit 600 replacing switch S1, and current source $I_{S2}$ comprising current source circuit 500 in series with switch S2. Moreover, current sources replacing switches S3 and S4 can comprise either or both types of current source circuits 500 and 600 in accordance with various other exemplary embodiments. Accordingly, the current sources utilized can be configured in any suitably arrangement of switched current sources to provide current to pump capacitor $C_{PUMP}$ and output capacitor $C_{RES}$ in order to reduce the output voltage ripple and the EMI emissions.

In accordance with another aspect of the present invention, as discussed above, by feeding or otherwise controlling the current into the charge pump capacitors with current sources, the voltage across the current sources can be suitably limited to the supply voltage or the output voltage. In that the current sources can operate as resistor devices with adjustable impedances, the current sources can be configured to suitably reduce or eliminate the excessive supply voltage across the current sources, i.e., the adjustable impedance configuration of the current sources facilitates the handling of a voltage drop across the current sources as needed by the charge pump circuit.

For example, in an embodiment in which switch S1 is replaced with switched current source $I_{S1}$ the voltage on node B can be limited to a voltage close to output voltage $V_{OUT}$. After replacing switch S1 with switched current source $I_{S1}$, the equivalent resistance between supply voltage $V_{IN}$ and node B is much larger than the on-resistance $R_{ON}$ of switch S4, e.g., an ideal current source may have infinite equivalent impedance. After capacitor $C_{PUMP}$ is fully charged to supply voltage $V_{IN}$, at the moment when switched current source $I_{S1}$ and switch S4 are closed, the initial inrush current, i.e., peak current, is limited to that of switched current source $I_{S1}$ by the high impedance of switched current source $I_{S1}$. In addition, switched current source $I_{S1}$ can be configured much smaller than current $I_{INRUSH}$, so that the voltage drop across switch S4 ($I_{S1}*R_{ON}$) is negligible. Therefore the voltage at node B approximately equals output voltage $V_{OUT}$. Moreover, if switch S4 instead of S1 is replaced by a current source, the voltage $V_B$ may rise up to $2*V_{IN}$ or $2*V_{OUT}$.

Accordingly, the requirement for the breakdown voltage can be significantly reduced, e.g., the breakdown voltage can be set by the higher value of the supply voltage or the output voltage, rather than a value one and a half, two or three times the input voltage as in prior art charge pump doubler and tripler configurations. In addition, through use of such low voltage processes, the cost and packaging size for the charge pump circuits can be suitably reduced.

The present invention has been described above with reference to an exemplary embodiment. However, those skilled in the art will recognize that changes and modifications may be made to the exemplary embodiment without departing from the scope of the present invention. For example, the various components may be implemented in alternate ways, such as, for example, the changing of transistor devices from PMOS to NMOS transistors and the changing of the polarity of the charge pump circuits. These alternatives can be suitably selected depending upon the particular application or in consideration of any number of factors associated with the operation of the system. In addition, the techniques described herein may be extended or modified for use with other integrated circuits separate from a charge pump circuit. These and other changes or modifications are intended to be included within the scope of the present invention, as expressed in the following claims.

What is claimed is:

1. A charge pump circuit configured for providing an output voltage, said charge pump circuit comprising:

an input terminal for receiving a supply voltage;

a charging capacitor configured for providing a stored voltage charge;

a reservoir capacitor configured for receiving the stored charge from said charging capacitor to provide said output voltage; and a current source circuit coupled between said input terminal and said charging capacitor, said current source circuit being configured for controlling a charging current flowing into said charging capacitor and for controlling a discharging current flowing from said charging capacitor to said reservoir capacitor to reduce voltage ripple and inrush current occurring at said output voltage.

2. A charge pump circuit according to claim 1, wherein said current source circuit comprises a single current source connected in series with said input terminal such that a first switching device is connected between said single current source and a first plate of said charging capacitor, and a second switching device is connected between said single current source and a second plate of said charging capacitor.

3. A charge pump circuit according to claim 2, wherein said charge pump circuit further comprises a second charging capacitor for providing a second stored voltage charge, said second switching device further connected between said single current source and a first plate of said second charging capacitor, and a third switching device connected between said single current source and a second plate of said second charging capacitor.

4. A charge pump circuit according to claim 1, wherein said current source circuit comprises a first current limited switch connected directly between said input terminal and a first plate of said first charging capacitor to control said discharging current in said charging capacitor, and a second current limited switch connected between said input terminal and a second plate of said charging capacitor to control said charging current in said charging capacitor.

5. A charge pump circuit according to claim 1, wherein said at least one current source comprises a first transistor and a diode-connected second transistor configured in a current mirror arrangement, said first transistor and second transistor having sources connected to an input voltage, said second transistor having a drain connected to a current reference, and said first transistor having a drain connected to an output reference.

6. A charge pump circuit according to claim 4, wherein at least one of said first current limited switch and said second current limited switch comprises:

a first current mirror circuit comprising a first transistor and a diode-connected second transistor, said first transistor and second transistor having sources connected to an input voltage, said second transistor having a drain connected to a current reference, and said first transistor having a drain connected to an output reference;

a control circuit configured for operating said at least one current limited switch, said control circuit comprising a voltage control signal coupled to gates of a pair of complementary transistors comprising a third transistor and a fourth transistor, said third transistor having a source connected to the input voltage, and a second current mirror circuit comprising a fifth transistor and a diode-connected sixth transistor, said fifth transistor and said sixth transistor having sources connected to ground, said fifth transistor having a drain connected to a source of said fourth transistor, and said sixth transistor having a drain connected to a current reference; and wherein said control circuit operates to turn on said at least one current limited switch when said voltage control signal is in a predefined condition.

7. A charge pump circuit configured for regulating an output voltage, said charge pump circuit comprising:

an input supply voltage;

a charging capacitor configured for providing a stored voltage charge;

a reservoir capacitor configured for receiving the stored charge from said charging capacitor to provide said output voltage; and a first current source comprising a first current limited switch connected between said input supply voltage and a first plate of said charging capacitor, said first current source being configured to control a discharging current in said charging capacitor to reduce voltage ripple occurring in the output voltage; and a second current source comprising a second current limited switch connected between said input supply voltage and a second plate of said charging capacitor, said second current source being configured to control a charging current in said charging capacitor to reduce inrush current occurring within said charge pump circuit.

8. A charge pump circuit according to claim 7, wherein said charge pump circuit is configured to regulate the output voltage by changing a switching frequency of one of said first current limited switch and said second current limited switch.

9. A charge pump circuit according to claim 7, wherein said charge pump circuit further comprises a second charging capacitor for providing a second stored voltage charge, a first switching device coupled between said second current source and a first plate of said second charging capacitor, a third current source comprising a third current limited switch, and a second switching device connected between said third current source and a second plate of said second charging capacitor.

10. A charge pump circuit according to claim 7, wherein said first current source comprises:

a first current mirror circuit comprising a first transistor and a diode-connected second transistor, said first transistor and second transistor having sources connected to an input voltage, said second transistor having a drain connected to a current reference, and said first transistor having a drain connected to an output reference;

a control circuit configured for operating said first current limited switch, said control circuit comprising a voltage control signal coupled to gates of a pair of complementary transistors comprising a third transistor and a fourth transistor, said third transistor having a source connected to the input voltage, and a second current mirror circuit comprising a fifth transistor and a diode-connected sixth transistor, said fifth transistor and said sixth transistor having sources connected to ground, said fifth transistor having a drain connected to a source of said fourth transistor, and said sixth transistor having a drain connected to a current reference; and wherein said control circuit activates said first current source when said voltage control signal is in a high condition.

11. A charge pump circuit according to claim 7, wherein said first current source is configured when said input supply voltage is low to provide a lower on-resistance to facilitate a larger discharging current to enable said output voltage reference to increase.

12. A charge pump circuit according to claim 7, wherein said second current source comprises:

a third current mirror circuit comprising a seventh transistor and a diode-connected eighth transistor, said seventh transistor and said eighth transistor having sources connected to an input voltage, said eighth transistor having a drain connected to a current reference, and said seventh transistor having a drain connected to an output reference;

a second control circuit configured for operating said second current limited switch, said second control circuit comprising a voltage control signal coupled to gates of a second pair of complementary transistors comprising a ninth transistor and a tenth transistor, said ninth transistor having a source connected to the input voltage, and a fourth current mirror circuit comprising an eleventh transistor and a diode-connected twelfth transistor, said eleventh transistor and said twelfth transistor having sources connected to ground, said eleventh transistor having a drain connected to a source of said tenth transistor, and said twelfth transistor having a drain connected to a current reference; and wherein said second control circuit activates said second current source when said voltage control signal is in a high condition.

13. A charge pump circuit according to claim 7, wherein said second current source is configured when said input supply voltage is low to provide a lower on-resistance to facilitate a larger charging current to enable said output voltage reference to increase.

14. An integrated circuit having an output terminal, said integrated circuit having a charge pump circuit configured for regulating an output voltage at the output terminal, said charge pump circuit comprising:

an input supply voltage;

a charging capacitor configured for providing a stored voltage charge;

a reservoir capacitor configured for receiving the stored charge from said charging capacitor to provide a regulated output voltage; and a first switched current source connected between said input supply voltage and a first plate of said charging capacitor, said switched current source being configured to control a discharging current in said charging capacitor through switching frequency regulation in said charge pump circuit, and thus facilitating reduction of voltage ripple occurring at said regulated voltage reference; and a second switched current source connected between said input supply voltage and a second plate of said charging capacitor, said second current source being configured to control said charging current in said charging capacitor to reduce inrush current occurring within said charge pump circuit.

15. An integrated circuit according to claim 14, wherein at least one of said first switched current source and said second current source comprises:

a first current mirror circuit comprising a first transistor and a diode-connected second transistor, said first transistor and second transistor having sources connected to an input voltage, said second transistor having a drain connected to a current reference, and said first transistor having a drain connected to an output reference;

a control circuit configured for operating said at least one of said first switched current source and said second switched current source, said control circuit comprising a voltage control signal coupled to gates of a pair of complementary transistors comprising a third transistor and a fourth transistor, said third transistor having a source connected to the input voltage, and a second current mirror circuit comprising a fifth transistor and a diode-connected sixth transistor, said fifth transistor and said sixth transistor having sources connected to ground, said fifth transistor having a drain connected to a source of said fourth transistor, and said sixth transistor having a drain connected to a current reference; and wherein said control circuit activates said current source when said voltage control signal is in a predefined condition.

16. A charge pump circuit according to claim 14, wherein said first switched current source is configured when said input supply voltage is low to provide a lower on-resistance to facilitate a larger discharging current to enable said regulated voltage reference to increase.

17. A charge pump circuit according to claim 14, wherein said first switched current source is configured to limit a nodal voltage at a node to approximately said input supply voltage and the output voltage to facilitate use of a low-voltage process, said node being configured between said second switched current source and said second plate of said charging capacitor.

18. A charge pump circuit according to claim 17, wherein said first switched current source is configured to significantly reduce requirements for a breakdown voltage of said charge pump circuit to approximately the output voltage.

19. A charge pump circuit configured for providing an output voltage, said charge pump circuit comprising:

an input terminal for receiving a supply voltage;

a charging capacitor configured for providing a stored voltage charge, said charging capacitor having a first plate and a second plate;

a reservoir capacitor configured for receiving the stored charge from said charging capacitor to provide said output voltage; said reservoir capacitor being coupled to said second plate of said charging capacitor through a switch device; and at least one current source coupled between said input terminal and at least one of said first plate and said second plate of said charging capacitor, said at least one current source being configured for controlling a charging current flowing into said charging capacitor and for controlling a discharging current flowing from said charging capacitor to said reservoir capacitor to reduce voltage ripple and inrush current occurring at said output voltage.

20. A charge pump circuit according to claim 19, wherein said at least one current source is configured to limit a nodal voltage at a node configured between said input terminal and said second plate of said charging capacitor to approximately said output voltage to facilitate use of lower voltage processes.

21. A charge pump circuit according to claim 20, wherein said at least one current source comprises a high equivalent resistance configured to limit said nodal voltage.

22. A charge pump circuit according to claim 20, wherein said at least one source is configured to limit a voltage drop across said switch device.

* * * * *